(12) United States Patent
Lu et al.

(10) Patent No.: US 10,283,604 B2
(45) Date of Patent: May 7, 2019

(54) CONTACT STRUCTURE FOR HIGH ASPECT RATIO AND METHOD OF FABRICATING THE SAME

(71) Applicant: TAIWAN SEMICONDUCTOR MANUFACTURING CO., LTD., Hsinchu (TW)

(72) Inventors: Szu-Hsien Lu, Tainan (TW); Hung-Che Liao, Tainan (TW); Kun-Tsang Chuang, Miaoli County (TW); Shih-Lu Hsu, Tainan (TW); Yu-Chu Lin, Tainan (TW); Jyun-Guan Jhou, Taoyuan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/815,593

(22) Filed: Jul. 31, 2015

(65) Prior Publication Data

US 2017/0033047 A1 Feb. 2, 2017

(51) Int. Cl.
*H01L 29/06* (2006.01)
*H01L 21/768* (2006.01)
*H01L 23/485* (2006.01)
*H01L 29/423* (2006.01)
*H01L 27/088* (2006.01)
*H01L 21/4763* (2006.01)

(52) U.S. Cl.
CPC .. *H01L 29/42356* (2013.01); *H01L 21/76897* (2013.01); *H01L 23/485* (2013.01); *H01L 29/0649* (2013.01)

(58) Field of Classification Search
CPC ......... H01L 2924/0002; H01L 2924/00; H01L 23/485; H01L 21/76877; H01L 23/5226; H01L 21/76802; H01L 21/76804; H01L 21/76897; H01L 23/53295; H01L 23/535; H01L 21/283; H01L 29/0649; H01L 29/42356; H01L 23/28; H01L 29/7809
USPC .......... 257/401, E21.582, E21.585, E21.658, 257/E21.577; 438/629, 612, 618
See application file for complete search history.

(56) References Cited

U.S. PATENT DOCUMENTS

| | | | | |
|---|---|---|---|---|
| 2001/0016413 A1* | 8/2001 | Lee | .................... | H01L 21/76838 438/629 |
| 2004/0065958 A1* | 4/2004 | Hachisuka | ........ | H01L 21/76807 257/758 |
| 2006/0019488 A1* | 1/2006 | Liaw | .................... | H01L 27/1104 438/637 |
| 2007/0099414 A1* | 5/2007 | Frohberg | .......... | H01L 21/76877 438/618 |

(Continued)

*Primary Examiner* — Nduka E Ojeh
(74) *Attorney, Agent, or Firm* — Hauptman Ham, LLP

(57) ABSTRACT

A method of fabricating semiconductor device includes forming a plurality of gate structures on a semiconductor substrate. A first inter layer dielectric layer is deposited on the gate structures. A first contact plug is formed in the first inter layer dielectric layer in between every two immediately adjacent gate structures. An etch stop layer is deposited on the first inter layer dielectric layer. A second inter layer dielectric layer is deposited on the first inter layer dielectric layer. A second contact plug is formed in the second inter layer dielectric layer aligning with the first contact plug. A metal layer is deposited overlying the second inter layer dielectric layer and the second contact plug.

20 Claims, 7 Drawing Sheets

(56) References Cited

U.S. PATENT DOCUMENTS

| | | | | |
|---|---|---|---|---|
| 2007/0257323 A1* | 11/2007 | Tsui | ............... | H01L 23/485 257/382 |
| 2008/0105917 A1* | 5/2008 | Hsieh | ............... | H01L 27/115 257/316 |
| 2009/0014779 A1* | 1/2009 | Kawashima | ...... | H01L 27/11568 257/324 |
| 2009/0014796 A1* | 1/2009 | Liaw | ............... | H01L 27/11 257/347 |
| 2012/0161327 A1* | 6/2012 | Chumakov | ....... | H01L 21/76804 257/773 |
| 2014/0017863 A1* | 1/2014 | Lee | ............... | H01L 29/66477 438/238 |

* cited by examiner

CONTACT STRUCTURE FOR HIGH ASPECT RATIO AND METHOD OF FABRICATING THE SAME

BACKGROUND

Conductivity in semiconductor devices can be achieved by various means. The conductive lines on different levels are usually connected through conductive plugs at a specific position. However, the number of building block, for example, a transistor, of the vast majority of semiconductor devices increases greatly. In a single semiconductor device, such as a high performance processor device, can includes millions of transistors. Therefore, decreasing transistor size and increasing its density is a great concern in the field since the device dimension inhibits any physical expansion of the transistor.

A conventional semiconductor device may include forming a contact hole in an inter layer dielectric (ILD) layer and then filling the contact hole with a conductive material. As the size and spacing of the transistors decreases, the aspect ratio of the contact hole increases significantly. As a result, it is more difficult to accurately and repeatedly form stacked contact structure.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
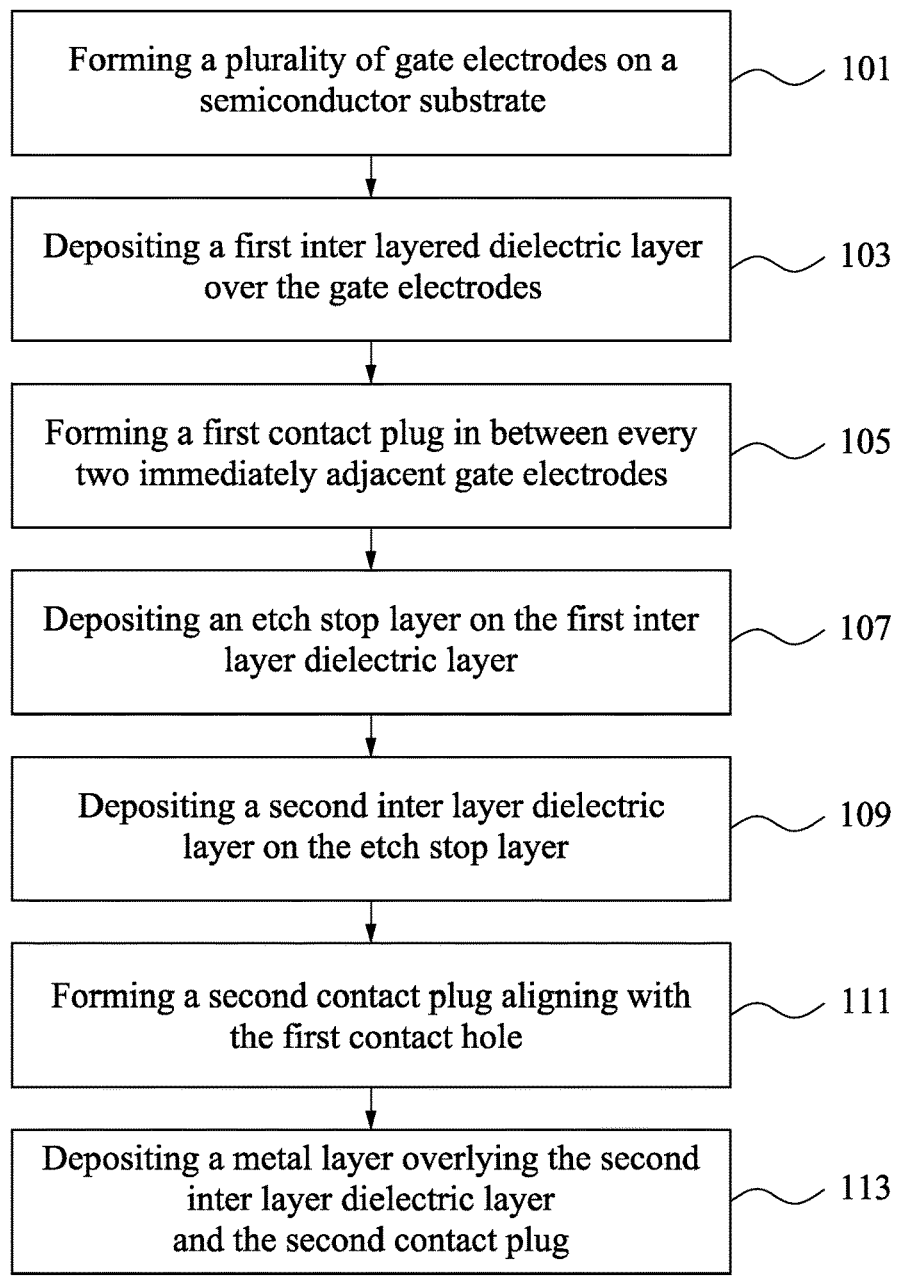
FIG. 1 is a flow chart showing a process of fabricating a semiconductor device in accordance with some embodiments of the instant disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A conventional stacked contact structure is formed by etching a contact hole in an inter layer dielectric (ILD) layer and filling in the contact hole with a conductive material. The ILD layer has a height that is equal to the height of the entire layer thickness. For example, if the layer is 6000 angstrom, the thickness of the ILD layer will be 6000 angstrom. The dimension of the contact hole is constrained by the thickness of the ILD layer. More specifically, the height of the contact hole will be 6000 angstrom. On the other hand, the width of the contact hole remains relatively narrow due to limited spacing. As a result, after filling in the conductive material to form a contact plug, the aspect ratio of the contact plug is high. In some cases, because of the semiconductor device design, the aspect ratio of the contact plug can be larger than 7:1.

A high aspect ratio implies a few drawbacks. In the process of forming the contact hole, some defects come along with the lengthy etching process. The bottom of the contact hole is prone to shrinkage at the end portion where the contact hole exposes the substrate. The reduction of contact hole in the width results in poor contact at the interface. In addition to the distorted contact hole, to etch the ILD layer to its full depth takes considerable amount of time. The longer the time consumed, the more the residues remain at the bottom of the contact hole. The high aspect ratio indicates longer etching period and more unwanted residues. The residues can hardly be completely removed because of the depth of the contact hole, and this contamination further reduces the conductivity of the contact plug.

Turning now to FIG. 1, illustrated is an embodiment of a method 10 for fabricating a semiconductor device including high aspect ratio stacked contact structure. Embodiments of the method 10 shown in FIG. 1 are further illustrated in the schematic diagrams of FIGS. 2 through 13, and reference should be made to these figures as called out in the text below.

Figure 2:
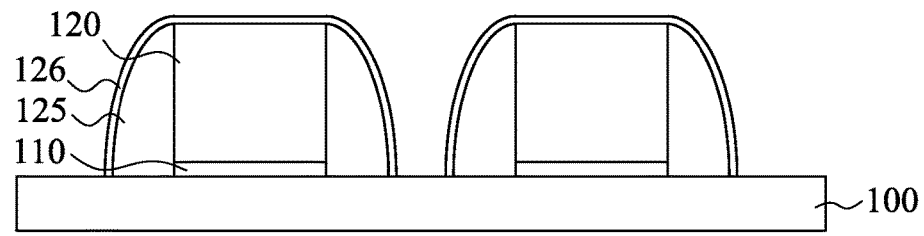
FIGS. 2-12 are schematic cross-sectional diagrams showing the process of fabricating a semiconductor device in accordance with some embodiments of the instant disclosure.

As set forth in block 101 in FIG. 1, gate electrodes are formed on a semiconductor substrate. This is illustrated in FIG. 2, which shows a substrate 100 and at least two gate electrodes 110. The substrate 100 is bulk silicon, but other commonly used materials and structures such as silicon on insulator (SOI) or a silicon layer overlying a bulk silicon germanium may also be used. As shown in FIG. 2, a gate dielectric material and a gate conductive material deposited on the semiconductor substrate 100 are patterned and respectively become a gate dielectric layer 110 and a gate electrode 120, both of which form together as a gate structure. The gate dielectric layer 110 may be formed of silicon oxide or a high-k dielectric material. The gate electrode 120 may be formed of amorphous polysilicon, doped polysilicon, metal, single crystalline silicon or other conductive materials.

Next, a dielectric spacer 125 is formed on each sidewall of the gate structure. The dielectric spacer 125 may be formed of oxide, nitride, oxynitride, or combinations thereof. A contact etch stop layer (CESL) 129 for controlling the end point during subsequent contact hole formation is deposited on the gate structure completed on the substrate 100. The CESL 126 may be formed of silicon nitride, silicon oxynitride, silicon carbide or combinations thereof.

Figure 3:
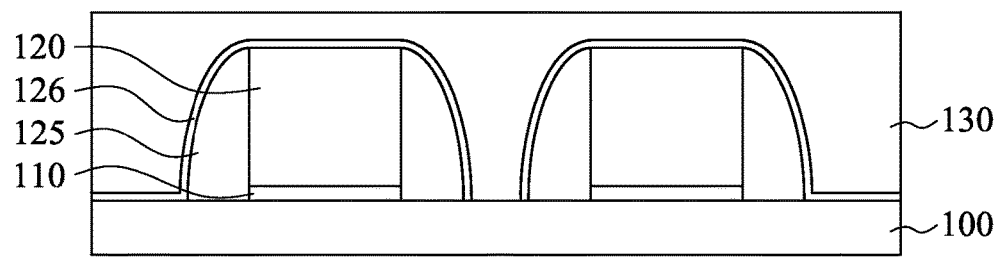

Returning to FIG. 1, a first inter layered dielectric (ILD) layer 130 is deposited over the gate structure, as set forth in block 103. This is illustrated in FIG. 3, where the first ILD layer 130 is formed overlying the CESL 126 so as to isolate the gate structure (i.e., the gate dielectric layer 110, gate electrode 120 and dielectric spacer 125) from a subsequent formation of a contact hole. The first ILD layer 130 may be a silicon oxide containing layer formed of doped or undoped silicon oxide by a thermal chemical vapor deposition (CVD) process or high-density plasma (HDP) process, e.g., undoped silicate glass (USG), phosphorous doped silicate glass (PSG) or boro-phosphosilicate glass (BPSG). Alternatively, the first ILD layer 130 may be formed of doped or P-doped spin-on-glass (SOG), PTEOS, or BPTEOS.

The top surface of the first ILD layer 130 is thinned and planarized to a predetermined height. The height of the first ILD layer 130 is just sufficient to insulate the gate structure and cannot be any thicker than its intended purpose because the thickness of the ILD layer determines the contact hole dimension in the subsequent process. The contact hole formation will be divided into two separate stages so as to overcome the previously mentioned defects usually seen in conventional fabrication process. As shown in FIG. 3, the first ILD layer 130 has a height that is capable of insulating the gate structure. More specifically, the thickness of the first ILD layer 130 should reach approximately three quarters of the entire length of the contact hole but not the total length of the contact hole. Typically, the thickness of an ILD layer will determine the dimension of the contact hole. Here, it is in reverse, the contact hole will determine the thickness of the first ILD layer 130 and in the later stage of a second ILD layer 160.

Figure 4:
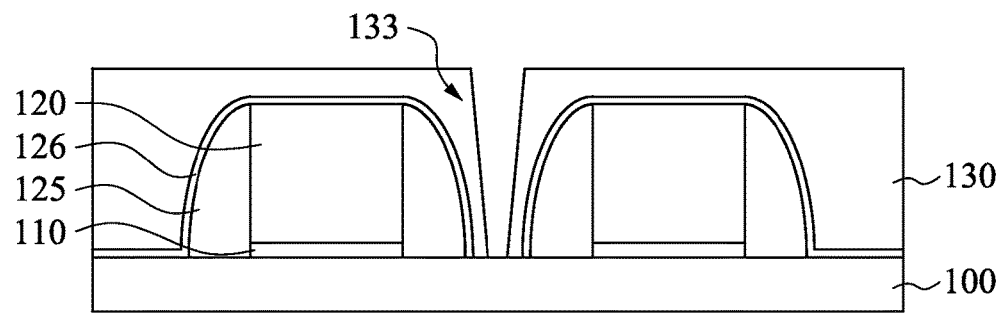
Figure 5:
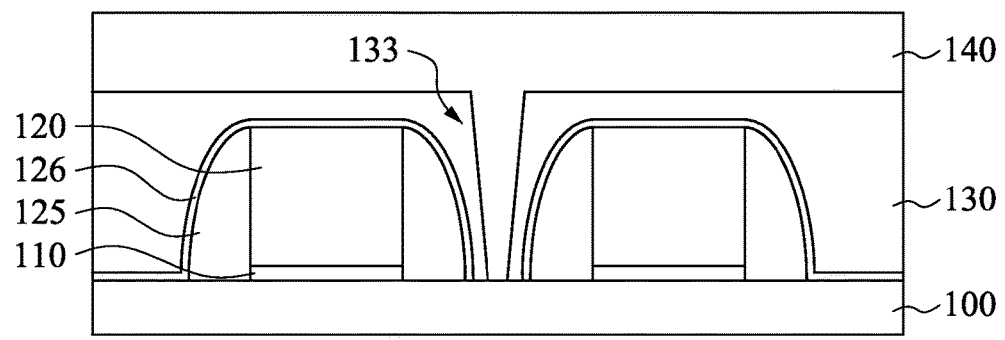
Figure 6:
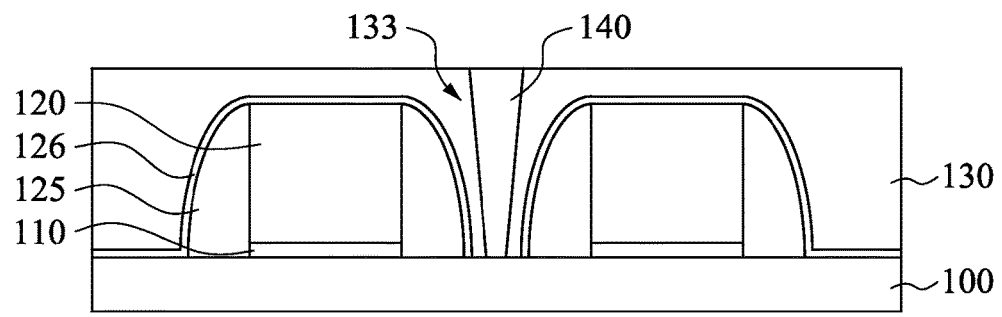

As set forth in block 105, one or more first contact plug is formed in the first ILD layer 130 in between every two immediately adjacent gate structures. This is illustrated in FIGS. 4-6, where a first contact hole 133 is formed and a first conductive material 140a is filled in to the first contact hole 133 to form the first contact plug 140. A lithographically patterned photoresist layer is provided, which is omitted in the figures for simplicity and clarity. More specifically, a light mask is disposed on the first ILD layer 130, and portions of the light mask are selectively removed (e.g., using photolithography or a suitable etchant chemistry) to define a mask that exposes portions of the first ILD layer 130 overlying the substrate 100 that will be removed to create the first contact hole 133 while leaving the portions of the light mask overlying the gate structure intact. In some embodiments of the instant disclosure, the first contact hole 133 is positioned in between a pair of immediately adjacent gate electrodes.

In an embodiment of the instant disclosure, a dry etching process is carried out to form the first contact hole 133 that passes through the first ILD layer 130 and exposes the underlying substrate 100 as shown in FIG. 4. The first contact hole 133 is formed using a typical lithographic process with masking technologies and anisotropic etching operation (e.g., plasma etching or reactive ion etching.) The light mask is then stripped. The depth of the first contact hole 133 is identical to the thickness of the first ILD layer 130.

Turning now to FIG. 5, illustrated is a first conductive material 140a filling in the void of the first contact hole 133. The first conductive material 140a is deposited over the substrate 100 and overfills the first contact hole 133 such that the first contact hole 133 is completely filled. Portions of the first conductive material 140a other than the first contact hole 133 are removed by chemical mechanical polishing (CMP). As shown in FIG. 6, the first ILD layer 130 is therefore exposed again, and the remaining portion of the first conductive material 140a filling the first contact hole 133 becomes the first contact plug 140. The first contact plug 140 is formed of tungsten or tungsten-based alloy. One method of forming the first contact plug 140 includes a selective tungsten chemical vapor deposition (W-CVD). For example, tungsten may be deposited essentially only on silicon exposed at the bottom of the first contact hole 133, and overgrowth of tungsten may then be removed with etching back.

Figure 7:
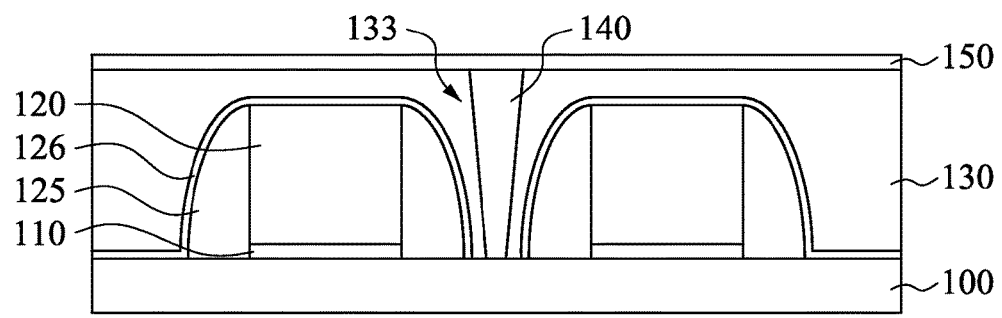

As set forth in block 107, an etch stop layer 150 is deposited on the first ILD layer 130. This is illustrated in FIG. 7, where the etch stop layer 150 blankets the first ILD layer 130 and the first contact plug 140. The etch stop layer 150 may be formed of silicon oxide, silicon nitride, silicon carbide, silicon oxynitride or combinations thereof, which may be formed through a variety of deposition techniques, including low-pressure chemical vapor deposition (LP-CVD), atmospheric-pressure chemical vapor deposition (APCVD), plasma-enhanced chemical vapor deposition (PECVD), physical vapor deposition (PVD), sputtering, and any other suitable deposition process.

Figure 8:
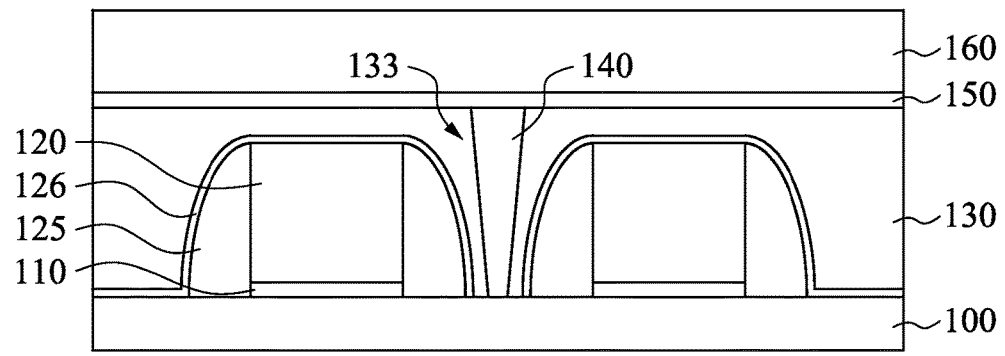

As set forth in block 109, a second inter layered dielectric (ILD) layer 160 is deposited on the etch stop layer 150. This is illustrated in FIG. 8, where the second ILD layer 160 blankets the etch stop layer 150. The second ILD layer 160 may be a silicon oxide containing layer formed of doped or undoped silicon oxide by a thermal CVD process or HDP process, e.g., USG, PSG or BPSG. The second ILD layer 160 may be formed of doped or P-doped SOG, PTEOS or BPTEOS. After the deposition of the second ILD layer 160, planarization, e.g., CMP, is performed. In terms of material and formation process, the second ILD layer 160 is identical to the first ILD layer 130.

Figure 9:
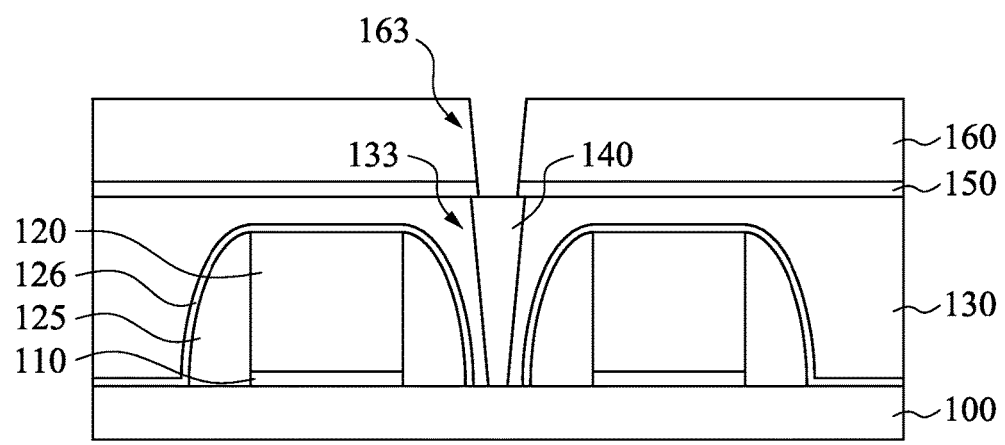
Figure 10:
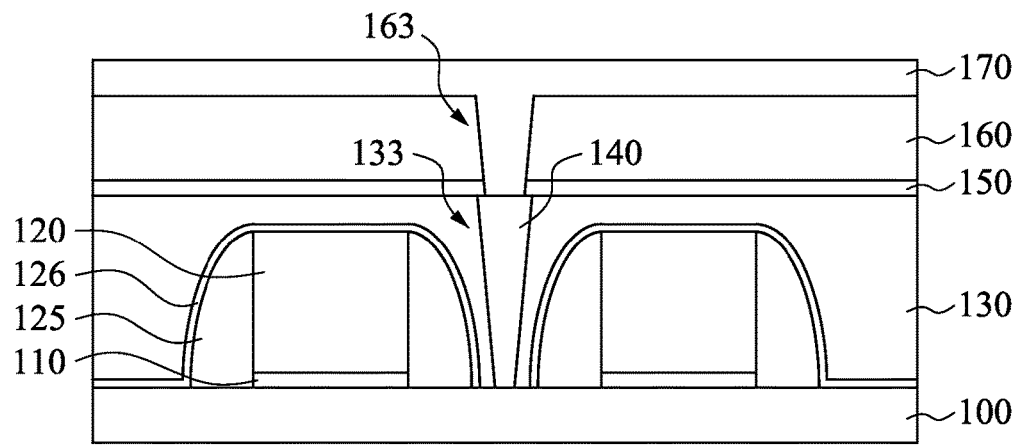
Figure 11:
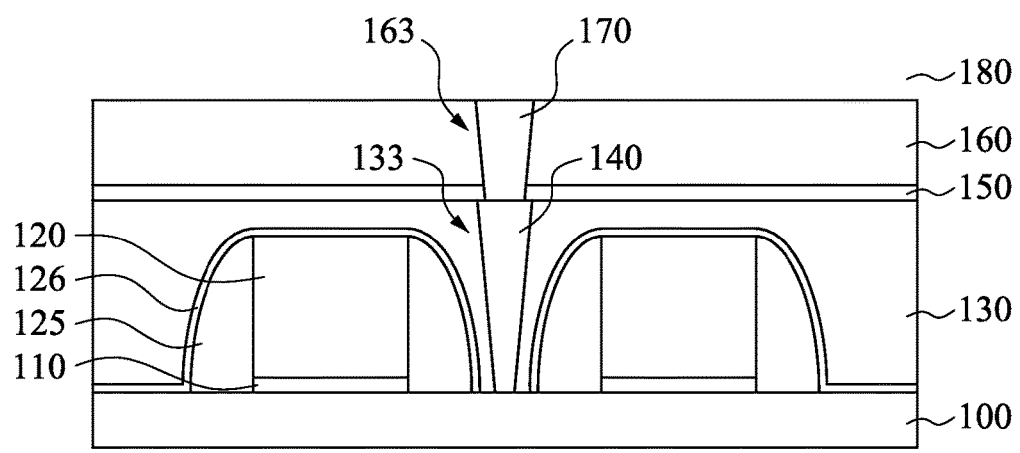

As set forth in block 111, a second contact plug 170 is formed in the second ILD layer 160, aligning with the first contact plug 140. This is illustrated in FIGS. 9-11, where a second contact hole 163 is formed in the second ILD layer 160, and a second conductive material 170a is filled in to the second contact hole 163 to form the second contact plug 170. The same lithographically patterned photoresist layer used in the formation of the first contact plug 140 is employed again, which is omitted in the figures for simplicity and clarity. More specifically, the light mask, having the same pattern for the first contact plug 140, is disposed on the etch stop layer 150. There is no need to define a new light mask because the same light mask, boring exactly the same pattern for the first contact hole 133, is used for the second contact hole 163. It saves a step of defining another light mask. The light mask exposes portions of the second ILD layer 160 overlying the etch stop layer 150 that will be removed to create the second contact hole 163 while leaving the remaining portions intact. The second contact hole 163 inherits the position of the first contact hole 133 due to using the same light mask. As shown in FIG. 9, after etching, the second contact hole 163 passes through the second ILD layer 160 and the etch stop layer 150 and exposes the underlying first contact plug 140.

Turning now to FIG. 10, illustrated is a second conductive material 170a filling in the void of the second contact hole 163. The second conductive material 170a is deposited over the first contact plug 140 and overfills the second contact hole 163 such that the first contact hole 133 is completely filled. Portions of the second conductive material 170a other than the second contact hole 163 are removed by chemical mechanical polishing (CMP). As shown in FIG. 11, the second ILD layer 160 is therefore exposed again, and the remaining portion of the second conductive material 170a filling the second contact hole 163 becomes the second contact plug 170. The second contact plug 170 is formed of tungsten or tungsten-based alloy. In some embodiments, the first and second materials 140a, 170a are the same.

The difference between the first and second ILD layers 130, 160 arises from their thickness (height). As previously discussed, the contact plugs have higher aspect ratio (larger than 6.9) because of the component architecture in a transistor. Typically, the contact hole is formed in one etching step. However, the high aspect ratio means the etching duration is long and residues scatter at the bottom of the contact hole. When the conductive material fills in, the contact plug greatly reduces at the end portion, resulting in poor contact. In the instant embodiment, the entire length of the contact plug is divided between the first and second contact plugs 140, 170. In other words, a single one contact plug is formed in two separate stages. The height of the first ILD layer 140 defines the depth of the first contact plug 140. Next, the second ILD layer 160 defines the depth of the second contact plug 170. Nevertheless, the combined length of the first and second contact plugs 140, 170 is then the entire length of a single contact plug.

The height of the first contact plug 140 is approximately three quarters of the total length of a complete contact plug, and the height of the second contact plug 170 complete the remaining height of the entire contact plug, which will be approximately one quarter thereof. The first and second ILD layers 130, 160 determine the dimension of the first and second contact plugs 140, 170 respectively. One single contact plug is formed in two separate stages, and the cumulative length of the first and second contact plugs contributes to a single contact plug dimension. On the other hand, in the two-stage etching process, the aspect ratio of the first and second contact holes 133, 163 greatly reduces, and therefore less time is required and fewer residues are produced, while the final aspect ratio remains the same.

Figure 12:
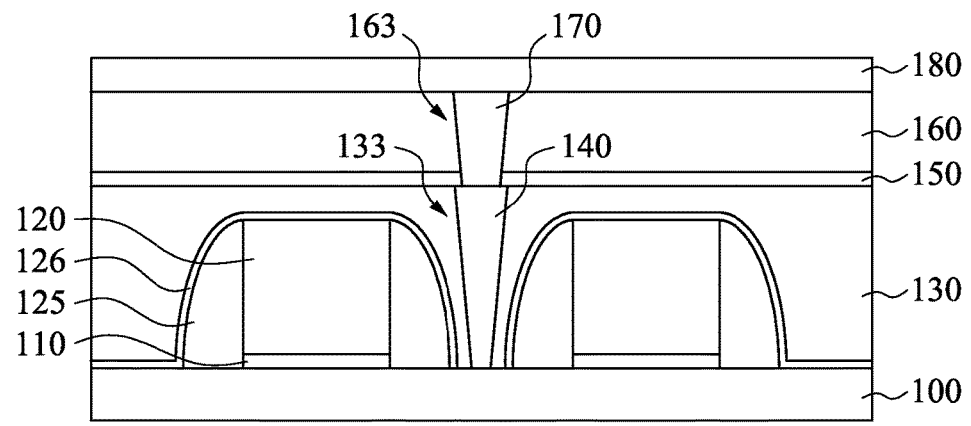

Referring to block 113 in FIG. 1, a metal layer is deposited over the second ILD layer. This is illustrated in FIG. 12, which shows the metal layer 180 overlying the second ILD layer 160. The metal layer 180 is deposited and patterned over the second ILD layer 160 to electrically couple the contact plugs 140, 170.

Figure 13:
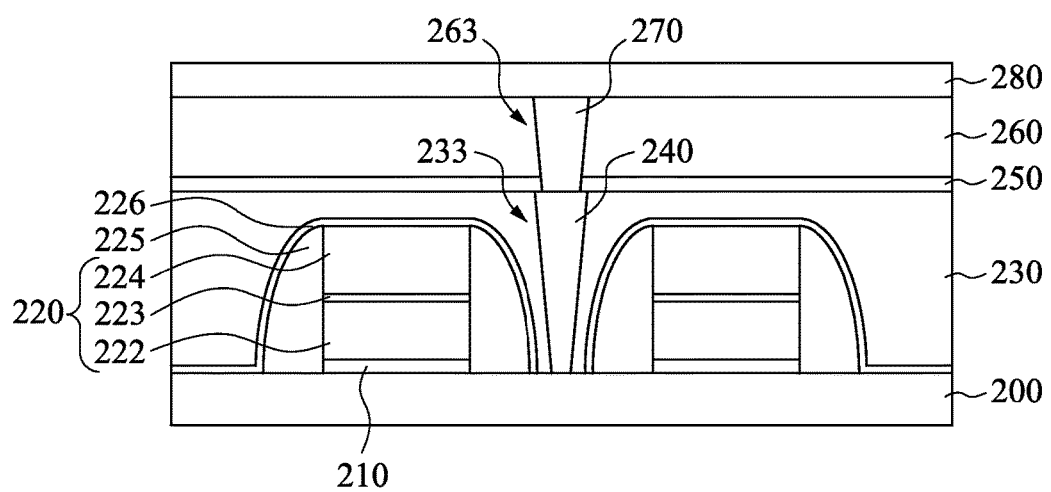
FIG. 13 is a schematic cross-sectional diagrams showing a semiconductor device in accordance with some embodiments of the instant disclosure.

Turning now to FIG. 13, illustrated is an embodiment of the instant disclosure. The gate electrodes 220 are formed on a semiconductor substrate 200. The substrate 200 is bulk silicon, but other commonly used materials and structures such as silicon on insulator (SOI) or silicon layer overlying a bulk silicon germanium may also be used. As shown in FIG. 13, a gate dielectric layer 210 is disposed on the substrate 200, and a floating gate poly 222 is disposed on the gate dielectric layer 210. An isolation film 223 is then disposed on the floating gate poly 222. A controlling gate poly 224 is disposed on the isolation film 223. The gate electrode 220 is then formed. Two dielectric spacers 225 are disposed on either side of the gate electrode, flanking the floating and controlling gate poly 222, 224. The dielectric spacer 225 may be formed of oxide, nitride, oxynitride, or combinations thereof. The contact etch stop layer (CESL) 226 blankets the substrate 200, spacers 225 and the top of the controlling gate poly 224 as shown in FIG. 13. The CESL 226 may be formed of silicon nitride, silicon oxynitride, silicon carbide or combinations thereof.

The first inter layered dielectric (ILD) layer 230 is disposed over the gate structure, so as to isolate the gate structure (i.e., the gate dielectric layer 210, gate electrode 220 and dielectric spacer 225) from a subsequent formation of the contact hole. The top surface of the first ILD layer 230 is thinned and planarized to a predetermined height. In the instant embodiment, the first ILD layer 230 has a thickness of approximately 4000 angstrom, which is just capable of electrically isolating the gate electrodes 220. As discussed previously, the thickness of the first ILD layer 220 corresponds to the height of the first contact hole so as to avoid a high aspect ratio in the process of contact hole formation. The first ILD layer should only account for approximately three quarters of the entire length of the contact plug. The contact hole will determine the thickness of the first ILD layer 230 and in the later stage of the second ILD layer 260. In case of a 6000-angstrom contact plug, the first ILD layer 230 spans 4000 angstrom. The first ILD layer 230 may be a silicon oxide containing layer formed of doped or undoped silicon oxide by a thermal chemical vapor deposition (CVD) process or high-density plasma (HDP) process, e.g., undoped silicate glass (USG), phosphorous doped silicate glass (PSG) or boro-phosphosilicate glass (BPSG). Alternatively, the first ILD layer 230 may be formed of doped or P-doped spin-on-glass (SOG), PTEOS, or BPTEOS.

A photolithography is conducted to pattern the first ILD layer 230 that will be removed to create the first contact hole 233 while leaving the portions of the light mask overlying the gate structure intact. The first contact hole 233 passes through the first ILD layer 230 and exposes the underlying substrate 200. As shown in FIG. 13, the first contact hole 233 is positioned in between a pair of immediately adjacent gate electrodes 220. The first conductive material 240a fills in to the first contact hole 233 to form the first contact plug 240. The depth of the first contact hole 233 is identical to the thickness of the first ILD layer 230.

The first conductive material 240a occupies the void of the first contact hole 233 where it contacts the underlying substrate 200. The first contact plug 240 is formed of tungsten or tungsten-based alloy. The etch stop layer 250 blankets the first ILD layer 130 and the first contact plug 140. The etch stop layer 250 may be formed of silicon oxide, silicon nitride, silicon carbide, silicon oxynitride or combinations thereof, which may be formed through a variety of deposition techniques. The second ILD layer 260 blankets the etch stop layer 250. In terms of material and formation process, the second ILD layer 260 is identical to the first ILD layer 230. However, the difference between the first and second ILD layers 230, 260 arises from the thickness. The thickness of the second ILD layer 260 takes up the remaining one quarter of the entire contact plug. The thinner second ILD layer 260 indicates a mild aspect ratio in the second contact hole formation, and therefore the etching duration and residues are greatly reduced. The combining dimension of the first and second ILD layers 230, 260 is the final aspect ratio, which is larger than 6.9, of the contact plug.

The second contact hole 263 is formed in the second ILD layer 260, and a second conductive material 270a fills in to the second contact hole 263 to form the second contact plug 270. The same lithographically patterned photoresist layer used in the formation of the first contact plug 140 is employed again. Therefore the second contact hole 263 inherits the position of the first contact hole 233 due to using the same light mask. The second contact hole 263 passes through the second ILD layer 260 and the etch stop layer 250 and exposes the underlying first contact plug 240. The second conductive material 270a fills in the second contact hole 263 to form the second contact plug 270. The second contact plug 270 is formed of tungsten or tungsten-based alloy. In some embodiments, the first and second materials 240a, 270a are the same. After chemical mechanical polishing, the metal layer 280 is disposed and patterned over the second ILD layer 160 to electrically couple the contact plugs 240, 270. The stacked contact is the completed.

As previously discussed, the contact plugs have higher aspect ratio (larger than 6.9) because of the component architecture in a transistor. Typically, the contact hole is formed in one etching step. However, the high aspect ratio means the etching duration is long and residues scatter at the bottom of the contact hole. When the conductive material fills in, the contact plug greatly reduces at the end portion, resulting in poor contact. According to the instant disclosure, the entire length of the contact plug is divided between the first and second contact plugs. In other words, a single one contact plug is formed in two separate stages. The height of the first ILD layer defines portions of the contact plug while the second ILD layer defines the remaining portion of the contact plug. The combination of the first and second contact plugs forms a complete contact plug. In this regard, the etching duration in each contact hole formation decreases because the first and second ILD layers divide the thickness of one contact plug. The first ILD layer has a thickness that is only capable of electrically isolating the gate electrodes so as to avoid high aspect ratio in the formation of the first contact hole. The second ILD layer completes the entire length of the contact plug, such that the original aspect ratio is preserved while the residues produced in the etching process are much less. That is to say, the contact plug is uniform in shape with good conductivity throughout its entire span.

One aspect of the instant disclosure provides a method of fabricating semiconductor device including forming a plurality of gate structures on a semiconductor substrate. A first inter layer dielectric layer is deposited on the gate structures. A first contact plug is formed in the first inter layer dielectric layer in between every two immediately adjacent gate structures. An etch stop layer is deposited on the etch stop layer. A second inter layer dielectric layer is deposited on the first inter layer dielectric layer. A second contact plug is formed in the second inter layer dielectric layer aligning with the first contact plug. A metal layer is deposited overlying the second inter layer dielectric layer and the second contact plug.

Another aspect of the instant disclosure provides a method of fabricating semiconductor device including forming a plurality of gate structures on a semiconductor substrate. A first inter layer dielectric layer is deposited on the gate structures. A first contact plug is formed in the first inter layer dielectric layer in between every two immediately adjacent gate structures. An etch stop layer is deposited on the first inter layer dielectric layer. A second inter layer dielectric layer is deposited on the etch stop layer. A second contact plug is formed in the second inter layer dielectric layer aligning with the first contact plug. The first and second contact plugs have a combined aspect ratio larger than 6.9. A metal layer is deposited overlying the second inter layer dielectric layer and the second contact plug.

Still another aspect of the instant disclosure provides a semiconductor device including a semiconductor substrate, a plurality of gate structures disposed on the semiconductor substrate, a first inter layer dielectric layer overlying the gate structures and the semiconductor substrate, a first contact plug disposed in between every two immediately adjacent gate structures, an etch stop layer disposed on the first inter layer dielectric layer, a second inter layer dielectric layer overlying the first etch stop layer, a second contact plug disposed on the first contact plug and a metal layer overlying the second inter layer dielectric layer and the second contact plug. The first and second contact plugs have a combined aspect ratio larger than 6.9.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating semiconductor device, comprising:
   forming a plurality of gate structures on a semiconductor substrate;
   forming a contact etch stop layer on sidewalls and a top surface of the gate structures;
   depositing a first inter layer dielectric layer over the contact etch stop layer;
   forming a first contact plug in the first inter layer dielectric layer in between any two immediately adjacent gate structures, wherein the first contact plug contacts a portion of the semiconductor substrate free of a silicide material;
   depositing an etch stop layer on the first inter layer dielectric layer;
   depositing a second inter layer dielectric layer in direct contact with the etch stop layer;
   forming a second contact plug in the second inter layer dielectric layer using the same light mask used in forming the first contact plug such that the first contact plug and the second contact plug have a combined aspect ratio larger than 6.9 and such that the first contact plug has a length longer than a length of the second contact plug; and
   depositing a metal layer overlying the second inter layer dielectric layer and the second contact plug.

2. The method of fabricating semiconductor device of claim 1, wherein the first contact plug and the second contact plug have an identical width profile.

3. The method of fabricating semiconductor device of claim 1, wherein the forming the first contact plug further comprises:
   disposing the light mask on the first inter layer dielectric layer;
   patterning the first inter layer dielectric layer according to the light mask to form a first contact hole; and
   depositing a first conductive material in the first contact hole.

4. The method of fabricating semiconductor device of claim 3, wherein the first contact hole exposes the portion of the semiconductor substrate.

5. The method of fabricating semiconductor device of claim 1, wherein the forming the second contact plug further comprises:
   disposing the light mask on the second inter layer dielectric layer;
   patterning the second inter layer dielectric layer according to the light mask to form a second contact hole; and depositing a second conductive material in the second contact hole.

6. The method of fabricating semiconductor device of claim 1, wherein a material of the first contact plug and the second contact plug are the same.

7. The method of fabricating semiconductor device of claim 1, wherein forming a first contact plug in the first inter layer dielectric layer further comprises:
planarizing the first inter layer dielectric layer to a height accounting for approximately three quarters of a combined length of the first and second contact plug.

8. A method of fabricating semiconductor device, comprising
forming a plurality of gate structures on a semiconductor substrate;
forming a contact etch stop layer on sidewalls and a top surface of the gate structures;
depositing a first inter layer dielectric layer over the contact etch stop layer;
forming a plurality of first contact plugs in the first inter layer dielectric layer;
wherein a first contact plug of the plurality of first contact plugs contacts a portion of the semiconductor substrate free of a silicide material;
depositing an etch stop layer on the first inter layer dielectric layer;
depositing a second inter layer dielectric layer on and in direct contact with the etch stop layer;
forming a plurality of second contact plugs in the second inter layer dielectric layer such that the number of the second contact plugs is the same as the number of the first contact plugs, wherein the first and second contact plugs have a combined aspect ratio larger than 6.9 and the first contact plugs have a length longer than a length of the second contact plugs; and
depositing a metal layer overlying the second inter layer dielectric layer and the second contact plug.

9. The method of fabricating semiconductor device of claim 8, wherein the first and second contact plugs have an identical width profile.

10. The method of fabricating semiconductor device of claim 8, wherein the forming the first contact plug further comprises:
disposing a light mask on the first inter layer dielectric layer;
patterning the first inter layer dielectric layer according to the light mask to form a plurality of first contact holes; and
depositing a first conductive material in the first contact holes.

11. The method of fabricating semiconductor device of claim 10, wherein a first contact hole of the plurality of first contact holes exposes the portion of the semiconductor substrate.

12. The method of fabricating semiconductor device of claim 8, wherein the forming the second contact plug further comprises:

disposing the light mask on the second inter layer dielectric layer;
patterning the second inter layer dielectric layer according to the light mask to form a plurality of second contact holes; and
depositing a second conductive material in the second contact holes.

13. The method of fabricating semiconductor device of claim 8, wherein a material of the first contact plug and the second contact plug are the same.

14. The method of fabricating semiconductor device of claim 8, wherein the forming the plurality of first contact plugs in the first inter layer dielectric layer further comprises:
planarizing the first inter layer dielectric layer to a height accounting for approximately three quarters of a combined length of the first and second contact plugs.

15. A semiconductor device, comprising
a semiconductor substrate;
a plurality of gate structures disposed on the semiconductor substrate;
a contact etch stop layer disposed on sidewalls and a top surface of the gate structures;
a first inter layer dielectric layer overlying the contact etch stop layer and the semiconductor substrate;
a first contact plug disposed in between any two immediately adjacent gate structures wherein the first contact plug contacts a portion of the semiconductor substrate free of a silicide material;
an etch stop layer disposed on the first inter layer dielectric layer;
a second inter layer dielectric layer overlying and in direct contact with the etch stop layer;
a second contact plug disposed on the first contact plug, wherein the first and second contact plugs have identical widths in a plane view and have a combined aspect ratio larger than 6.9 and the first contact plug has a length longer than a length of the second contact plug; and
a metal layer overlying the second inter layer dielectric layer and the second contact plug.

16. The semiconductor device of claim 15, wherein the first contact plug has a height equal to a thickness of the first inter layer dielectric.

17. The semiconductor device of claim 15, wherein the first and second contact plugs comprise tungsten or tungsten-based alloy.

18. The semiconductor device of claim 15, wherein the first inter layer dielectric layer has a height accounting for approximately three quarters of a combined length of the first and second contact plug.

19. The semiconductor device of claim 15, wherein a portion of the first contact plug is between the gate structures.

20. The semiconductor device of claim 15, wherein a portion of the first contact plug is above the gate structures.

* * * * *